US012692595B2

(12) United States Patent
Sadeghi

(10) Patent No.: US 12,692,595 B2
(45) Date of Patent: Jul. 28, 2026

(54) AUTOMATED CLEANING OF ROBOT ARMS OF SUBSTRATE PROCESSING SYSTEMS

(71) Applicant: LAM RESEARCH CORPORATION, Fremont, CA (US)

(72) Inventor: Hossein Sadeghi, San Jose, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 649 days.

(21) Appl. No.: 17/788,965

(22) PCT Filed: Dec. 30, 2020

(86) PCT No.: PCT/US2020/067397
§ 371 (c)(1),
(2) Date: Jun. 24, 2022

(87) PCT Pub. No.: WO2021/141806
PCT Pub. Date: Jul. 15, 2021

(65) Prior Publication Data
US 2022/0403506 A1     Dec. 22, 2022

Related U.S. Application Data

(60) Provisional application No. 62/958,059, filed on Jan. 7, 2020.

(51) Int. Cl.
*C23C 16/44*          (2006.01)
*H10P 72/00*          (2026.01)
*H10P 72/30*          (2026.01)

(52) U.S. Cl.
CPC ...... *C23C 16/4405* (2013.01); *C23C 16/4412* (2013.01); *H10P 72/0464* (2026.01); *H10P 72/0466* (2026.01); *H10P 72/3302* (2026.01)

(58) Field of Classification Search
None
See application file for complete search history.

(56) References Cited

U.S. PATENT DOCUMENTS 7,846,845 B2     12/2010   Bahng et al.
11,583,899 B1 *   2/2023   Roy ..................... B25J 19/0058
(Continued)

FOREIGN PATENT DOCUMENTS

JP          H11329955 A      11/1999
JP          2007157898 A      6/2007
(Continued)

OTHER PUBLICATIONS

Japanese Search Report for Japanese Application No. 2022-540634 mailed Aug. 15, 2024.
(Continued)

*Primary Examiner* — Jeffrie R Lund
*Assistant Examiner* — Tiffany Z Nuckols

(57)          ABSTRACT

A system includes a plurality of inlets configured to dispense a gas into an enclosure of a substrate processing system. The enclosure is separate from processing chambers of the substrate processing system that process a semiconductor substrate. The system includes a controller configured to move into the enclosure a robot arm used to transport the semiconductor substrate between the processing chambers of the substrate processing system. The controller is configured to dispense the gas into the enclosure through one or more of the inlets in response to the robot arm being moved into the enclosure of the substrate processing system.

20 Claims, 14 Drawing Sheets

(56)                    References Cited

U.S. PATENT DOCUMENTS

| | | | | |
|---|---|---|---|---|
| 2001/0004878 | A1 | 6/2001 | Sakai et al. | |
| 2007/0125405 | A1 | 6/2007 | Sekiguchi et al. | |
| 2008/0099040 | A1* | 5/2008 | Bahng ............... | H01L 21/02057 |
| | | | | 134/21 |
| 2010/0068010 | A1* | 3/2010 | Jhong ............... | H01L 21/67742 |
| | | | | 414/222.01 |
| 2010/0279014 | A1* | 11/2010 | Hiroki ............... | H01L 21/67751 |
| | | | | 427/294 |
| 2012/0234364 | A1* | 9/2012 | Muramoto ........ | H01L 21/67766 |
| | | | | 134/104.1 |
| 2020/0341390 | A1* | 10/2020 | Hsieh .................... | G03F 7/2002 |
| 2022/0008966 | A1* | 1/2022 | Liao ................. | H01L 21/67046 |
| 2022/0080476 | A1* | 3/2022 | Amikura ........... | H01J 37/32862 |

FOREIGN PATENT DOCUMENTS

| | | | |
|---|---|---|---|
| JP | 2007311691 | A | 11/2007 |
| JP | 2009164213 | A | 7/2009 |
| JP | 2012199327 | A | 10/2012 |
| KR | 1020090095501 | A | 9/2009 |

OTHER PUBLICATIONS

International Search Report and Written Opinion of the ISA issued in PCT/US2020/067397, mailed Apr. 27, 2021; ISA/KR.

* cited by examiner

AUTOMATED CLEANING OF ROBOT ARMS OF SUBSTRATE PROCESSING SYSTEMS

CROSS-REFERENCE TO RELATED APPLICATIONS

This application is a U.S. National Phase Application under 35 U.S.C. 371 of International Application No. PCT/US2020/067397, filed on Dec. 30, 2020, which claims the benefit of U.S. Provisional Application No. 62/958,059, filed on Jan. 7, 2020. The entire disclosures of the applications referenced above are incorporated herein by reference.

FIELD

The present disclosure relates generally to substrate processing systems and more particularly to automated cleaning of robot arms of substrate processing systems.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

A substrate processing system typically includes a plurality of processing chambers (also called process modules) to perform deposition, etching, and other treatments of substrates such as semiconductor wafers. Examples of processes that may be performed on a substrate include, but are not limited to, a plasma enhanced chemical vapor deposition (PECVD) process, a chemically enhanced plasma vapor deposition (CEPVD) process, and a sputtering physical vapor deposition (PVD) process. Additional examples of processes that may be performed on a substrate include, but are not limited to, etching (e.g., chemical etching, plasma etching, reactive ion etching, etc.) and cleaning processes.

During processing, a substrate is arranged on a substrate support such as a pedestal, an electrostatic chuck (ESC), and so on in a processing chamber of the substrate processing system. During deposition, gas mixtures including one or more precursors are introduced into the processing chamber, and plasma is struck to activate chemical reactions. During etching, gas mixtures including etch gases are introduced into the processing chamber, and plasma is struck to activate chemical reactions. A computer-controlled robot typically transfers substrates from one processing chamber to another in a sequence in which the substrates are to be processed.

SUMMARY

A system comprises a plurality of inlets configured to dispense a gas into an enclosure of a substrate processing system. The enclosure is separate from processing chambers of the substrate processing system that process a semiconductor substrate. The system comprises a controller configured to move into the enclosure a robot arm used to transport the semiconductor substrate between the processing chambers of the substrate processing system. The controller is configured to dispense the gas into the enclosure through one or more of the inlets in response to the robot arm being moved into the enclosure of the substrate processing system.

In other features, the enclosure includes one or more of an airlock chamber, a vacuum transfer module (VTM), and an equipment front end module (EFEM) of the substrate processing system.

In another feature, the controller is configured to move the robot arm in one or more directions within the enclosure while the gas is being dispensed into the enclosure of the substrate processing system.

In another feature, the controller is configured to move the robot arm within the enclosure in a predetermined pattern while the gas is being dispensed into the enclosure of the substrate processing system.

In another feature, the controller is configured to dispense the gas through the inlets by operating the inlets in a predetermined sequence.

In another feature, the controller is configured to dispense the gas through the inlets at a predetermined flow rate.

In another feature, the controller is configured to dispense the gas through the inlets at different flow rates.

In other features, the controller is configured to dispense the gas through a first set of the inlets in response to the robot arm being of a first type, and to dispense the gas through a second set of the inlets in response to the robot arm being of a second type, where the second set of inlets is different than the first set of inlets.

In other features, the system further comprises a gas source configured to supply the gas, and a plurality of regulators configured to regulate delivery of the gas from the gas source to the plurality of inlets, respectively. The controller is configured to control the regulators while delivering the gas to the plurality of inlets.

In other features, the system further comprises a valve and a pump configured to exhaust from the enclosure the gas dispensed into the enclosure and particulate matter ejected from the robot arm into the enclosure by the gas dispensed into the enclosure.

In still other features, a method comprises moving a robot arm used to transport a semiconductor substrate in a substrate processing system into an enclosure of the substrate processing system. The enclosure is separate from processing chambers of the substrate processing system that process the semiconductor substrate. The method comprises dispensing a gas through one or more of a plurality of inlets into the enclosure of the substrate processing system in response to moving the robot arm into the enclosure of the substrate processing system.

In other features, the enclosure includes one or more of an airlock chamber, a vacuum transfer module (VTM), and an equipment front end module (EFEM) of the substrate processing system.

In another feature, the method further comprises moving the robot arm in one or more directions within the enclosure while dispensing the gas into the enclosure of the substrate processing system.

In another feature, the method further comprises moving the robot arm within the enclosure in a predetermined pattern while dispensing the gas into the enclosure of the substrate processing system.

In another feature, the method further comprises dispensing the gas through the inlets by operating the inlets in a predetermined sequence.

In another feature, the method further comprises comprising dispensing the gas through the inlets at a predetermined flow rate.

In another feature, the method further comprises dispensing the gas through the inlets at different flow rates.

In other features, the method further comprises dispensing the gas through a first set of the inlets in response to the robot arm being of a first type, and dispensing the gas through a second set of the inlets in response to the robot arm being of a second type, where the second set of inlets is different than the first set of inlets.

In other features, the method further comprises supplying the gas from a gas source, regulating delivery of the gas from the gas source to the plurality of inlets via a plurality of regulators, respectively, and controlling the regulators while delivering the gas to the plurality of inlets.

In another feature, the method further comprises expelling from the enclosure the gas dispensed into the enclosure and particulate matter ejected from the robot arm into the enclosure by the gas dispensed into the enclosure.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Figure 2:
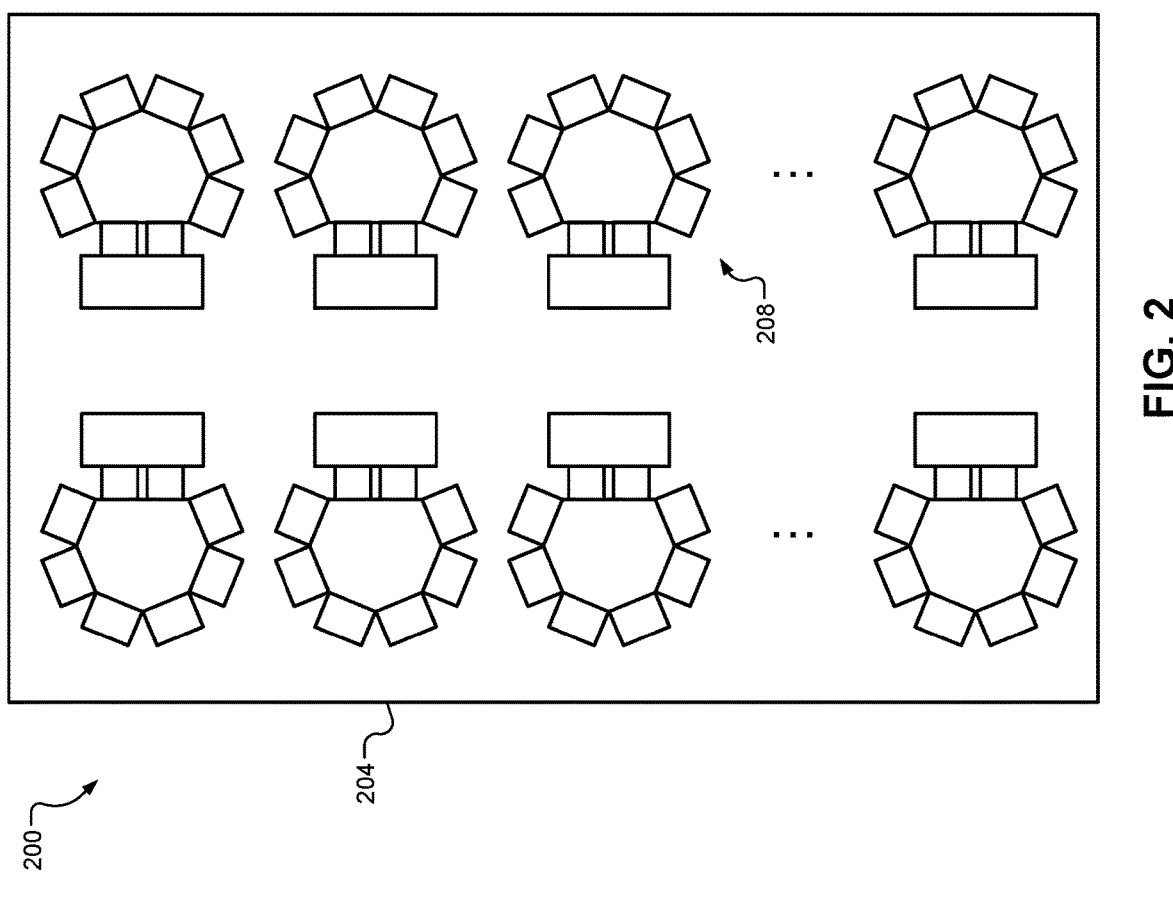
FIG. 2 shows an example arrangement of the substrate processing tools in a fabrication facility.

Routine maintenance keeps semiconductor equipment (e.g., a substrate processing system or a tool) up and running. During routine maintenance, the tool is typically down for a period of time while the maintenance is being performed. The down time can be very costly. Therefore, automating some of the maintenance routines can reduce the down time of the tool and the time it takes for a person (man hours) to perform the maintenance procedures, which can lead to reduced cost of ownership.

The system and method of the present disclosure provide a systematic way for one of the maintained routines—cleaning of robot arms—to be performed in an automated manner. This technique reduces tool down time, reduces the time it takes for a person to perform this routine, and allows for a repeatable way to perform this maintenance procedure across a fleet of tools. Faster and more efficient cleaning of the robot arms can improve productivity and yield by reducing the possibility of exposing wafers to particles removed from the robot arms.

The system according to the present disclosure includes gas purge ports or inlets located on top and bottom surfaces (and optionally also sides) of an airlock chamber (or other portions or enclosures of a tool as described below). A robot arm is moved into the airlock chamber, and a purge gas is injected or dispensed from these ports onto the robot arm. For example, an inert or a nonreactive gas such as N2 or clean dry air (CDA) is flushed (i.e., injected or dispensed) at a controlled flow rate onto top/bottom surfaces of the robot arm and its end effector, which causes particulate matter to be removed from the robot arm and its end effector.

The system removes the particles ejected from the robot arm into the airlock chamber using an airlock auto-clean system after the robot arm auto-clean procedure is completed. The airlock auto-clean procedure is performed using multiple pump/purge cycles after the robot arm is removed from the airlock chamber and the airlock chamber doors are closed. The same purge ports are used to flush particles off the airlock chamber and pumped out of the airlock chamber through an exhaust port or an outlet located at the bottom of the airlock chamber. By placing the purge ports in the airlock chamber, both ATM and VTM robots arms can be cleaned by the same purge hardware. As explained below, the robot arm can be moved under the top purge ports and/or above the bottom purge ports in a pattern along X, Y, and Z axes for a more effective particle removal rate. Alternatively or additionally, the purge ports can be activated/deactivated by opening/closing respective valves in a pattern for effective cleaning. Alternatively or additionally, the flow rates of the purge gas through the purge ports can be altered by controlling respective regulators for effective cleaning. These and other features of the present disclosure are explained below in detail.

Organization

The present disclosure is organized as follows. Initially, numerous examples of substrate processing tools, their configurations, and processing chambers used therein are shown and described with reference to FIGS. 1-7C. Thereafter, FIGS. 8 and 9 respectively show examples of a system and a method for cleaning the robot arms according to the present disclosure.

FIGS. 1-7C and corresponding description are provided to illustrate various processes that can be performed on different wafers and various paths through which different robots transport the wafers between different chambers and tools. Further, these figures are provided to illustrate various configurations of the tools in which different robots are used to transfer the wafers between process modules in a tool as well as across the tools.

The systems and methods of the present disclosure can be integrated and used in conjunction with other systems used with these tools to diagnose, correct, and prevent problems, and to perform various adjustments, calibrations, and preventive maintenance procedures in the chambers and the tools. The systems and methods of the present disclosure can operate standalone or in conjunction with these other systems and can significantly improve the diagnostic, corrective, and preventive procedures performed in the chambers and the tools.

FIGS. 1-7C provide insights into the operations of the chambers and the tools, which help in comprehending the need for and scope of the cleaning system of the present disclosure. For example, these figures provide insights as to how the robot arms get exposed to different materials while transporting wafers, which can make the robot arms dirty and even slippery at times, and which can cause significant damage to wafers. These figures also provide insights as to how periodic automatic cleaning of the robot arms can prevent contamination of wafers handled by the robot arms and can ensure error-free operation of the robot arms. Further, these figures and their descriptions help understand a variety of locations where the system of the present disclosure can be installed in different tools. Accordingly, these figures and their description provide insights into the need for and scope of operations performed by the system and method of the present disclosure.

Examples of Tools

Figure 1:
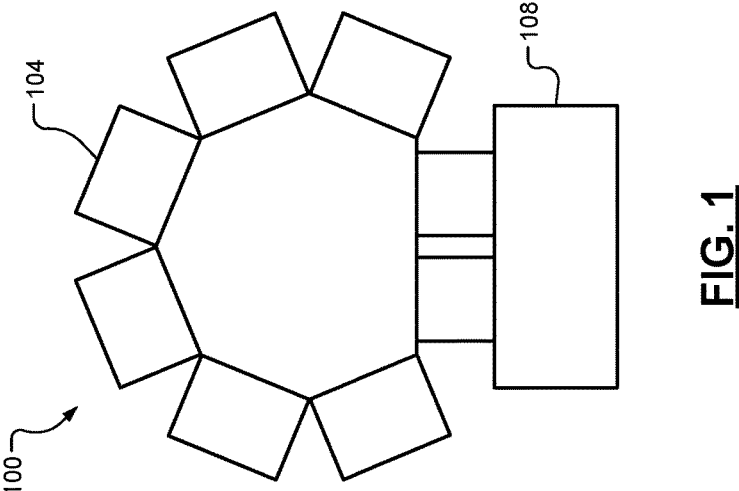
FIG. 1 shows an example of a substrate processing tool.

FIG. 1 shows a top-down view of an example of a substrate processing tool 100. The substrate processing tool 100 includes a plurality of process modules 104. For example only, each of the process modules 104 may be configured to perform one or more respective processes on a substrate. Substrates to be processed are loaded into the substrate processing tool 100 via ports of a loading station of an equipment front end module (EFEM) 108 and then transferred into one or more of the process modules 104. For example, a substrate may be loaded into each of the process modules 104 in succession. As will be explained in detail with reference to FIGS. 8 and 9, a cleaning system including gas purge ports can be installed in the EFEM 108.

FIG. 2 shows an example arrangement 200 of a fabrication room 204 including a plurality of substrate processing tools 208 such as the substrate processing tool 100. FIGS. 3A-3I show various examples of configurations in which the plurality of substrate processing tools 208 such as the substrate processing tool 100 can be arranged. In these examples, the wafers travel through varying paths. Accordingly, the configuration and operation of the robots used to transport the wafers through these paths vary. Further, a variety of sensors are used in these examples to sense various aspects of robots and the wafers. In addition, in these examples, as will be explained in detail with reference to FIGS. 8 and 9, a cleaning system including gas purge ports to clean a robot arm can be installed in various locations these examples.

Figures 3A, 3B, 3C:
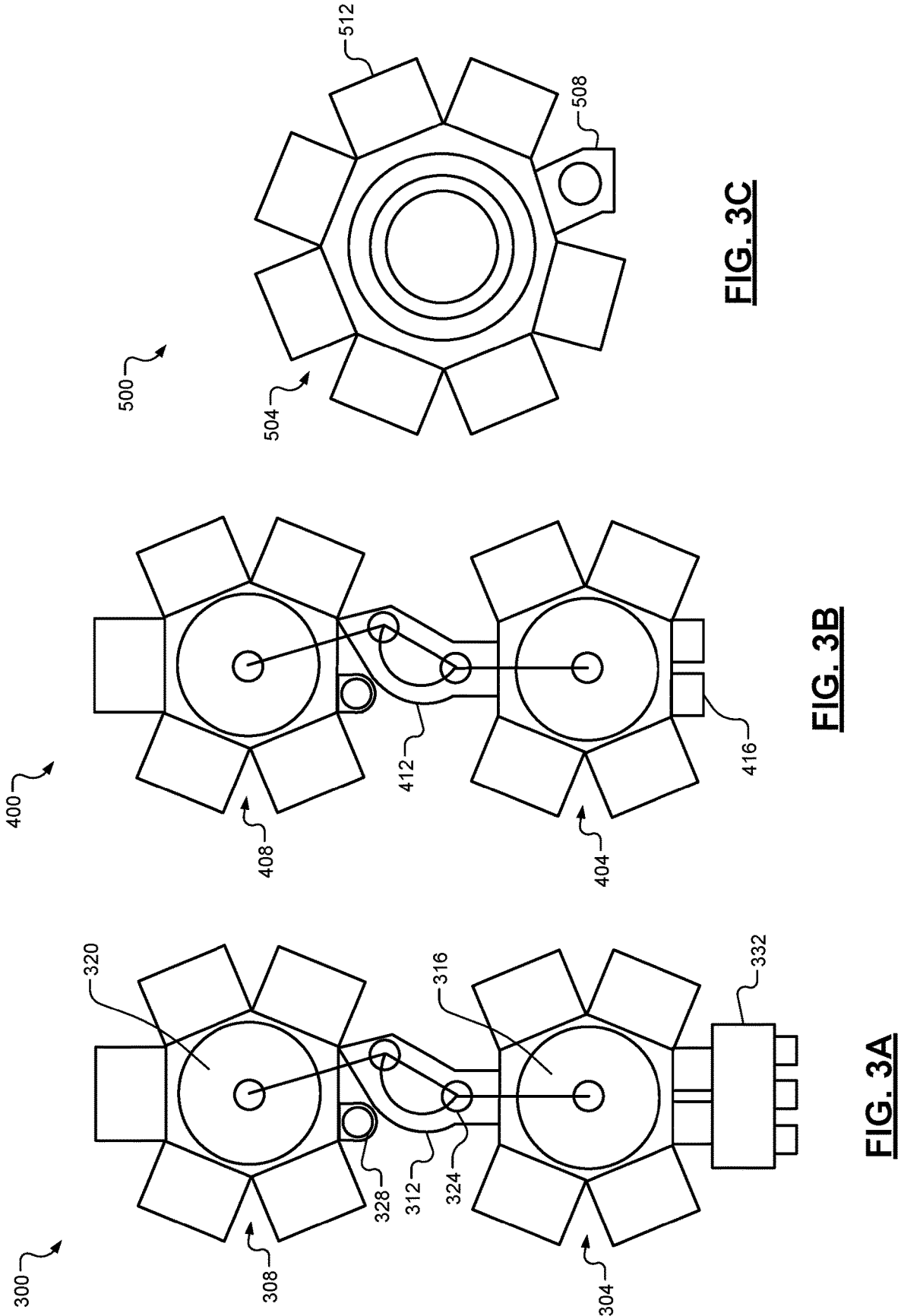
FIG. 3A-3I show various example configurations of the substrate processing tools.

FIG. 3A shows a first example configuration 300 including a first substrate processing tool 304 and a second substrate processing tool 308 according to the principles of the present disclosure. The first substrate processing tool 304 and the second substrate processing tool 308 are arranged sequentially and are connected by a transfer stage 312, which is under vacuum. As shown, the transfer stage 312 includes a pivoting transfer mechanism configured to transfer substrates between a vacuum transfer module (VTM) 316 of the first substrate processing tool 304 and a VTM 320 of the second substrate processing tool 308. In other examples, the transfer stage 312 may include other suitable transfer mechanisms, such as a linear transfer mechanism.

For example only, a first robot of the VTM 316 may place a substrate on a support 324 arranged in a first position, the support 324 is pivoted to a second position, and a second robot of the VTM 320 retrieves the substrate from the support 324 in the second position. In some examples, the second substrate processing tool 308 may include a storage buffer 328 configured to store one or more substrates between processing stages. The transfer mechanism may also be stacked to provide two or more transfer systems between the substrate processing tools 308 and 304. Transfer stage 324 may also have multiple slots to transport or buffer multiple substrates at one time. In the configuration 300, the first substrate processing tool 304 and the second substrate processing tool 308 are configured to share a single equipment front end module (EFEM) 332.

FIG. 3B shows a second example configuration 400 including a first substrate processing tool 404 and a second substrate processing tool 408 arranged sequentially and connected by a transfer stage 412. The configuration 400 is similar to the configuration 300 of FIG. 3A except that in the configuration 400, the EFEM is eliminated. Accordingly, substrates may be loaded into the first substrate processing tool 408 directly via airlock loading stations 416 (e.g., using a storage or transport carrier such as a vacuum wafer carrier, front opening unified pod (FOUP), etc., or other suitable mechanisms).

FIG. 3C shows a third example configuration 500 including a substrate processing tool 504. The configuration 500 eliminates the EFEM and uses only a single loading station 508, allowing for a greater number (e.g., 7) of process modules 512. At the loading station 508, substrates may be loaded into the second substrate processing tool 408 directly via airlock loading station 416 (e.g., using a storage or transport pod such as a Vacuum Wafer Carrier, front opening unified pod (FOUP), etc., or other suitable mechanisms).

Figures 3D, 3E:
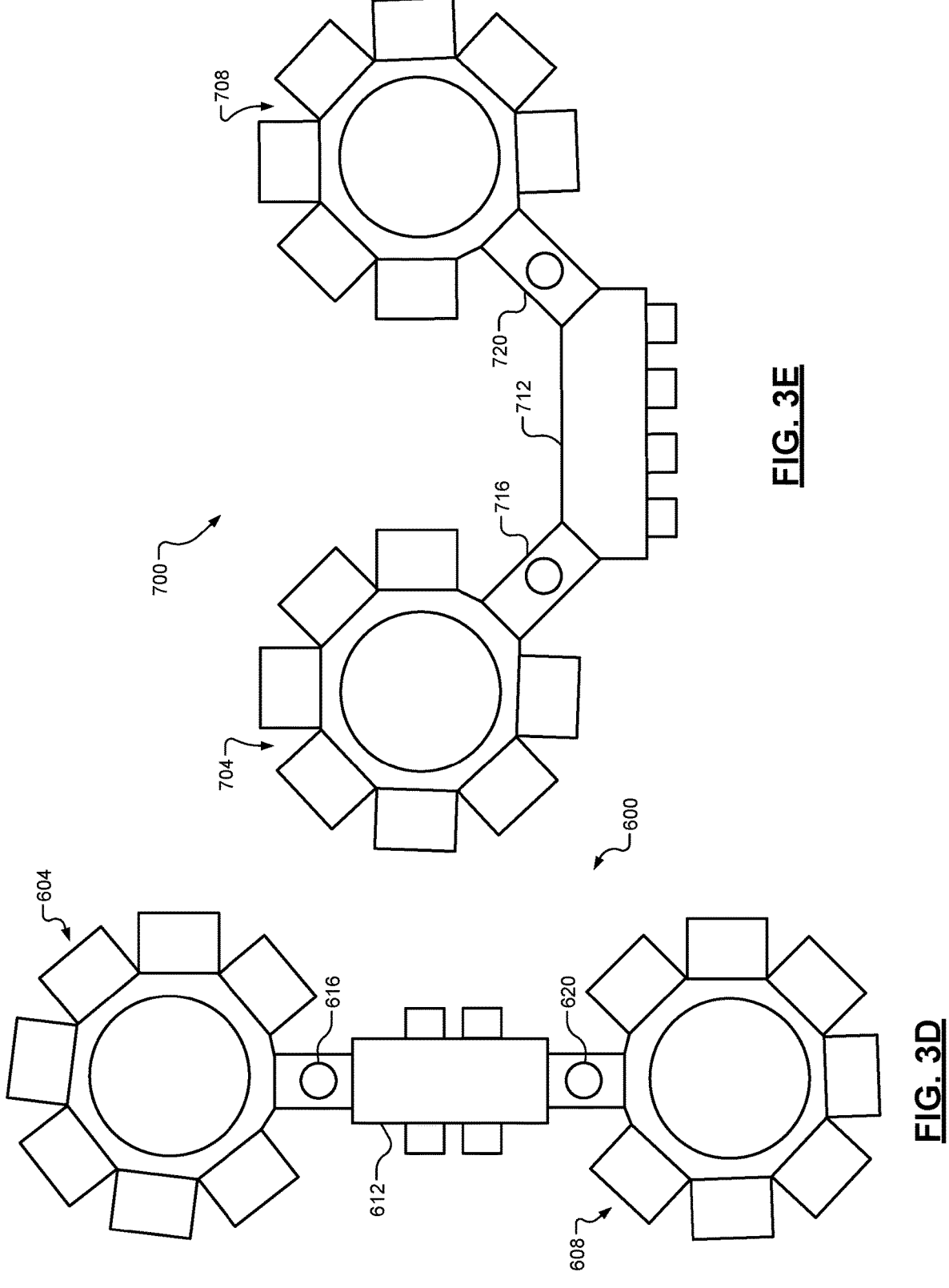

FIG. 3D shows a fourth example configuration 600 including a first substrate processing tool 604 and a second substrate processing tool 608 sharing a single EFEM 612. More specifically, the first substrate processing tool 604 and the second substrate processing tool 608 are connected to respective ends of the EFEM 612 via respective loading stations 616 and 620. The loading stations 616 and 620 may each have a stacked configuration.

FIG. 3E shows a fifth example configuration 700 including a first substrate processing tool 704 and a second substrate processing tool 708 sharing a single EFEM 712. The first substrate processing tool 704 and the second substrate processing tool 708 are connected to respective ends of the EFEM 712 via respective loading stations 716 and 720. The loading stations 716 and 720 may each have a stacked configuration.

Figure 3F:
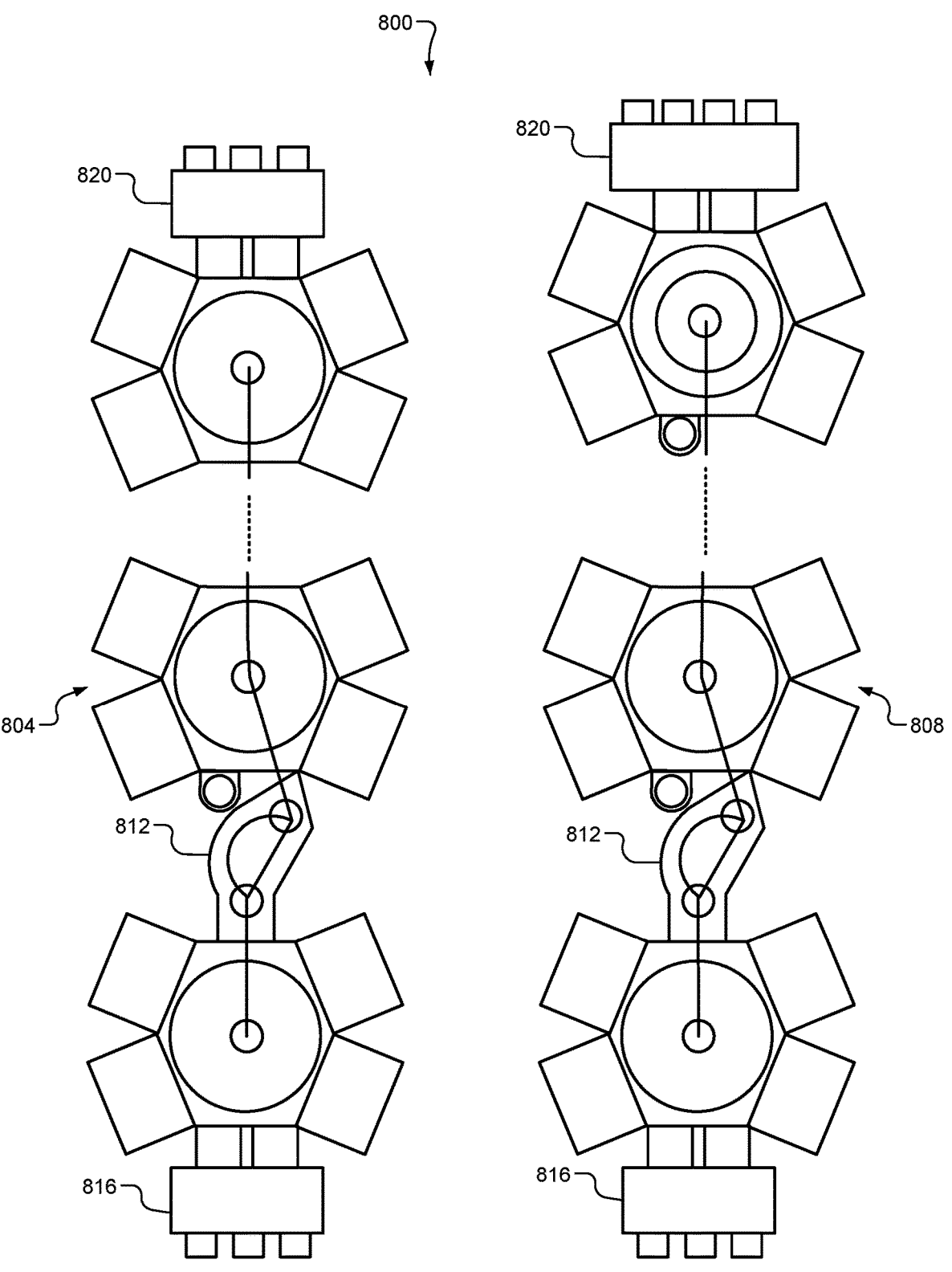

FIG. 3F shows a sixth example configuration 800 including one or more rows of sequentially arranged substrate processing tools 804, 808, etc. In the configuration 800, each row may include 3 or more substrate processing tools connected via respective transfer stages 812. The transfer stages 812 may include pivoting transfer mechanisms, linear transfer mechanisms, etc. A first EFEM 816 is provided at a first end of the row of substrate processing tools 804, 808 and a second EFEM 820 is provided at a second end of the row of substrate processing tools 804, 808. For example, substrates may be loaded at the first EFEM 816, processed and transferred sequentially through the various process modules of the substrate processing tools 804, 808, and then unloaded/retrieved from the second EFEM 820. In some examples, transfer mechanisms within the transfer stages 812 may be vertically stacked to provide two or more transfer systems between adjacent substrate processing tools. The transfer stages 812 may also have multiple slots to move or buffer multiple substrates at a time.

Figure 3H:
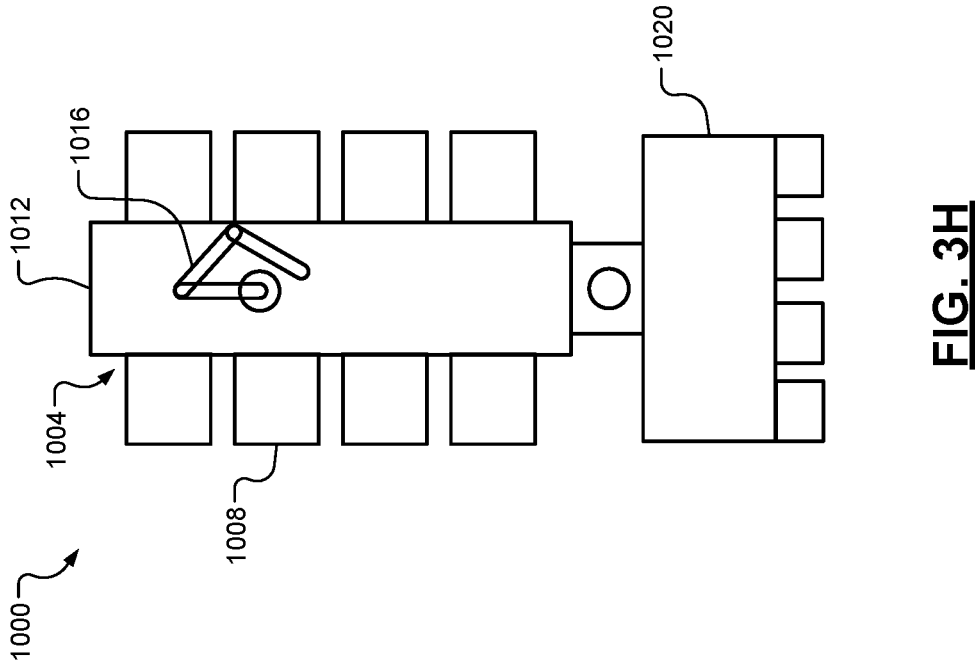
Figure 3G:
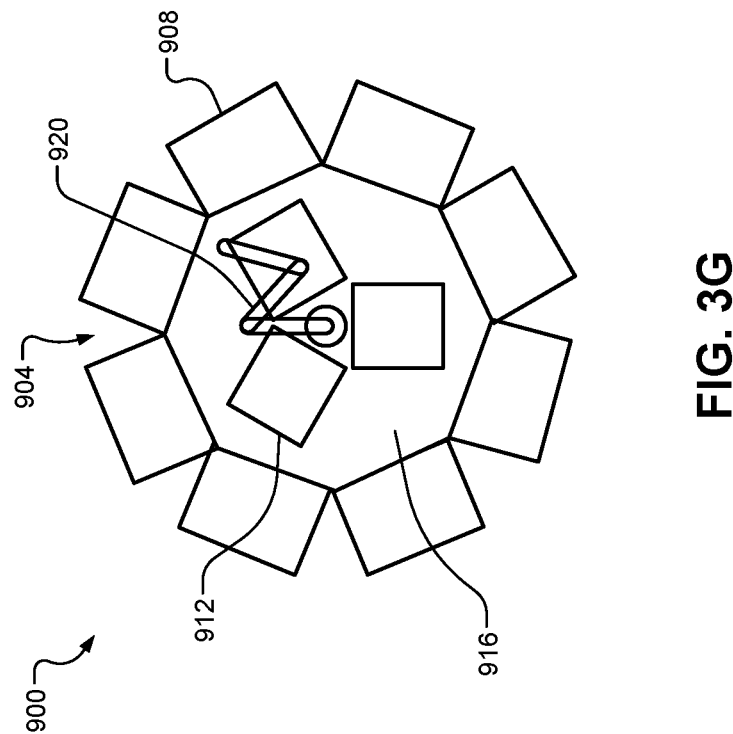

FIG. 3G shows a seventh example configuration 900 including a substrate processing tool 904. In the configuration 900, the substrate processing tool 904 includes, for example, 8 process modules 908 and eliminates both the EFEM and any exterior loading stations. Instead, one or more transport carriers (e.g., vacuum wafer carriers) 912 are provided in an interior 916 of the substrate processing tool

904. For example, the carriers 912 may be transported from above the substrate processing tool 904 using an automated transport system, such as an automated material handling system (AMHS). A robot 920 retrieves substrates from the carriers 912 and transfers the substrates to the process modules 908.

FIG. 3H shows an eighth example configuration 1000 including a substrate processing tool 1004 having a plurality of process modules 1008. The substrate processing tool 1004 includes a linear VTM 1012 and robot 1016 configured to transfer substrates between EFEM 1020 and the process modules 1008. The VTM 1012 is configured to adjust a linear position of the robot 1016 relative to the process modules 1008 (i.e., adjust an end-to-end position of the robot 1016 relative to the VTM 1012).

Figure 3I:
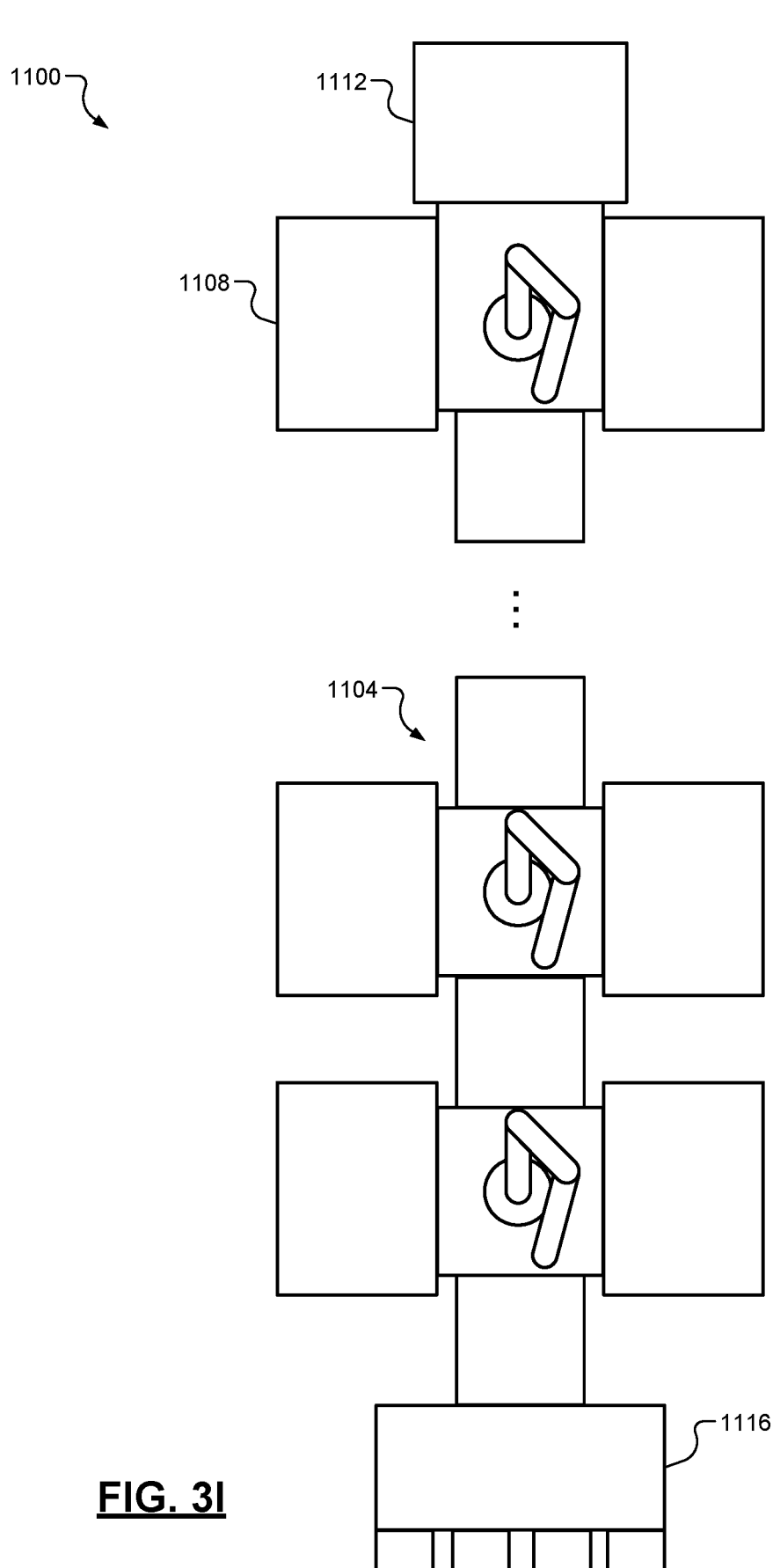
Figure 5A:
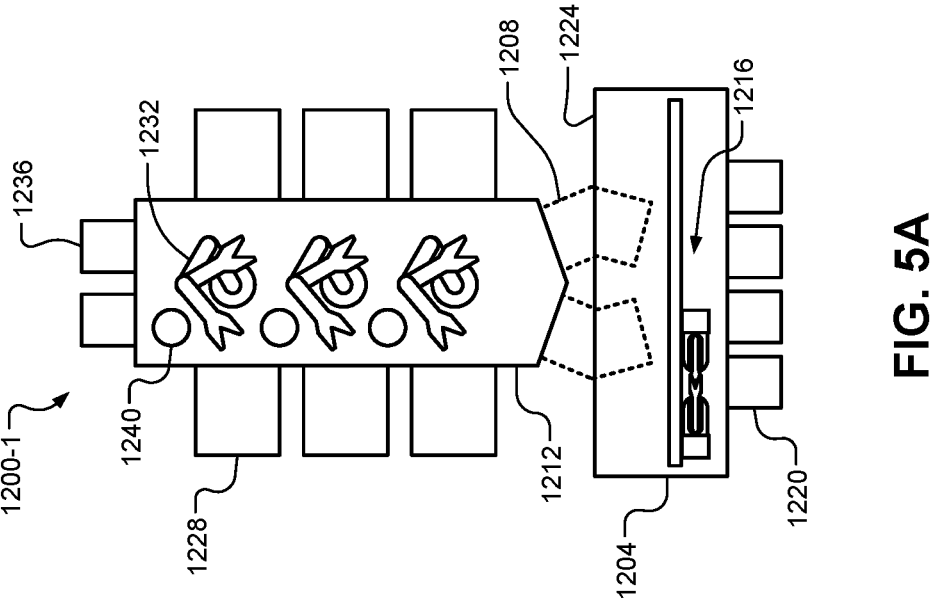
FIGS. 5A through 5D show plan views of various example configurations of the substrate processing tools.

FIG. 3I shows a ninth example configuration 1100 including a substrate processing tool 1104. The substrate processing tool 1104 includes a cluster arrangement of process modules 1108, and an optional end process module 1112. The process modules 1108 share a single EFEM 1116.

In some examples, any of the processing tools described herein may implement loading stations having a stacked configuration. For example, loadings stations 508, 716, 720, etc. as shown in FIGS. 3C and 3E may implement a stacked configuration. In other words, in a stacked configuration, a loading station may include two or more vertically stacked loading stations. In some examples, the stacked configuration may also include a process module or chamber (such as an integrated critical strip (ICS) chamber) vertically stacked with one or more loading stations.

In the above examples, as will be explained in detail with reference to FIGS. 8 and 9, a cleaning system including gas purge ports to clean various robot arms can be installed in various locations (e.g., EFEM, VTM, airlocks).

Additional Examples of Tools

Figure 4:
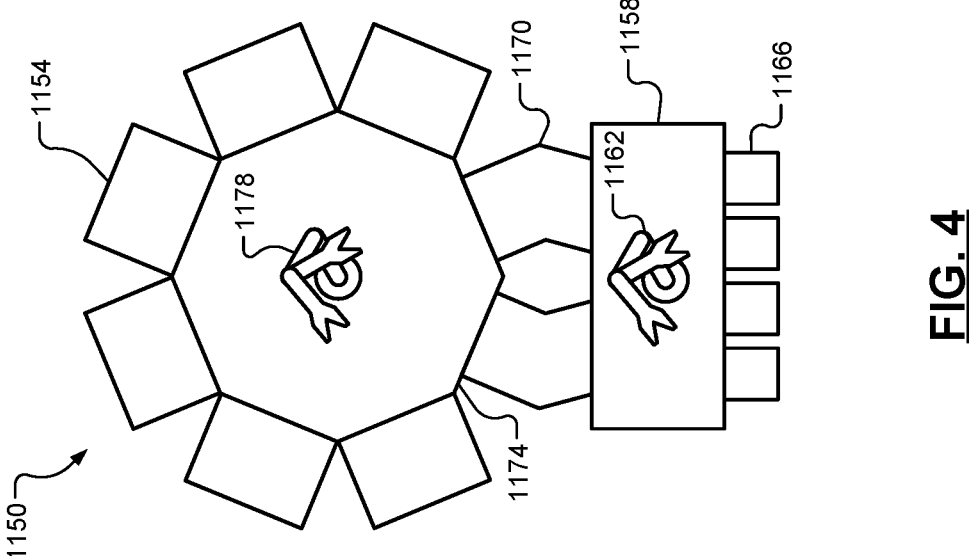
FIG. 4 shows another example of a substrate processing tool.

FIG. 4 shows a top-down view of yet another example of a substrate processing tool 1150. The substrate processing tool 1150 includes a plurality of process modules 1154. For example, each of the process modules 1154 may be configured to perform one or more respective processes on a substrate. Substrates to be processed are loaded into the substrate processing tool 1150 via ports of a loading station of an atmosphere-to-vacuum (ATV) transfer module, such as an equipment front end module (EFEM) 1158, and then transferred into one or more of the process modules 1154. For example, a transfer robot 1162 is arranged to transfer substrates from loading stations 1166 to airlocks, or load locks, 1170, and a vacuum transfer robot 1178 of a vacuum transfer module 1174 is arranged to transfer substrate from the load locks 1170 to the various process modules 1154.

For example, an equipment front end module (EFEM) of a substrate processing tool may include one or more transfer robots for transferring substrates between the EFEM and load locks arranged between the EFEM and a vacuum transfer module (VTM). An internal volume of the EFEM must be sufficient to accommodate the transfer robot. Accordingly, the load locks are typically located outside of a footprint of an equipment front end module (EFEM) between the EFEM and the VTM. In some examples, the EFEM may include a transfer robot having a configuration that allows the airlocks to be located at least partially within the EFEM. The fabrication room 204 shown in FIG. 2 may include a plurality of substrate processing tools 1150.

FIGS. 5A-6C show various examples of configurations in which the plurality of substrate processing tools such as the substrate processing tool 1150 can be arranged. In these examples, the wafers travel through varying paths. Accordingly, the configuration and operation of the transfer robots used to transport the wafers through these paths vary. Further, a variety of sensors are used in these examples to sense various aspects of the transfer robots and the wafers. In addition, in these examples, as will be explained in detail with reference to FIGS. 8 and 9, a cleaning system including gas purge ports to clean various robot arms can be installed in various locations (e.g., EFEM, VTM, airlocks).

FIGS. 5A-5D show plan views of example configurations of a first substrate processing tool 1200-1, a second substrate processing tool 1200-2, and a third substrate processing tool 1200-3 (collectively substrate processing tools 1200). Each of the substrate processing tools 1200, similar to the substrate processing tool 1150, includes a modified equipment front end module (EFEM) 1204 configured to accommodate at least a portion of load locks 1208. In other words, instead of being located outside of the EFEM 1204 in a gap between the EFEM 1204 and a vacuum transfer module (VTM) 1212, the load locks 208 extend into an interior of the EFEM 1204.

Accordingly, the EFEM 1204 can be located closer to the VTM 1212, reducing the overall footprint and increasing the pitch of the substrate processing tools 1200. For example, a transfer robot 1216 of the EFEM 1204 is arranged closer to loading stations 1220 on a front wall (e.g., a first side) than a back wall 1224 (e.g., a second side) of the EFEM 1204 to provide space for the load locks 1208 to extend into the interior of the EFEM 1204. In some examples, the load locks 1208 may be configured as shown in an alternative arrangement of the substrate processing tool 1200-3 in FIG. 5D. For example only, the loading stations 1220 may correspond to front opening unified pods (FOUPs).

As shown, the substrate processing tools 1200 include six process modules 1228. However, other configurations of the substrate processing tools 1200 may include more than six of the process modules 228. For example, a length of the VTM 1212 may be extended to accommodate additional process modules 1228. Similarly, the VTM 1212 may include vacuum transfer robots 1232 having various configurations. For example, the substrate processing tool 1200-1 includes three vacuum transfer robots 1232 and the substrate processing tool 1200-2 includes two vacuum transfer robots 1232. In the substrate processing tools 1200-1 and 1200-3, the robots 1232 are aligned with a center lengthwise axis of the VTM 1212.

Figures 5B, 5C, 5D:
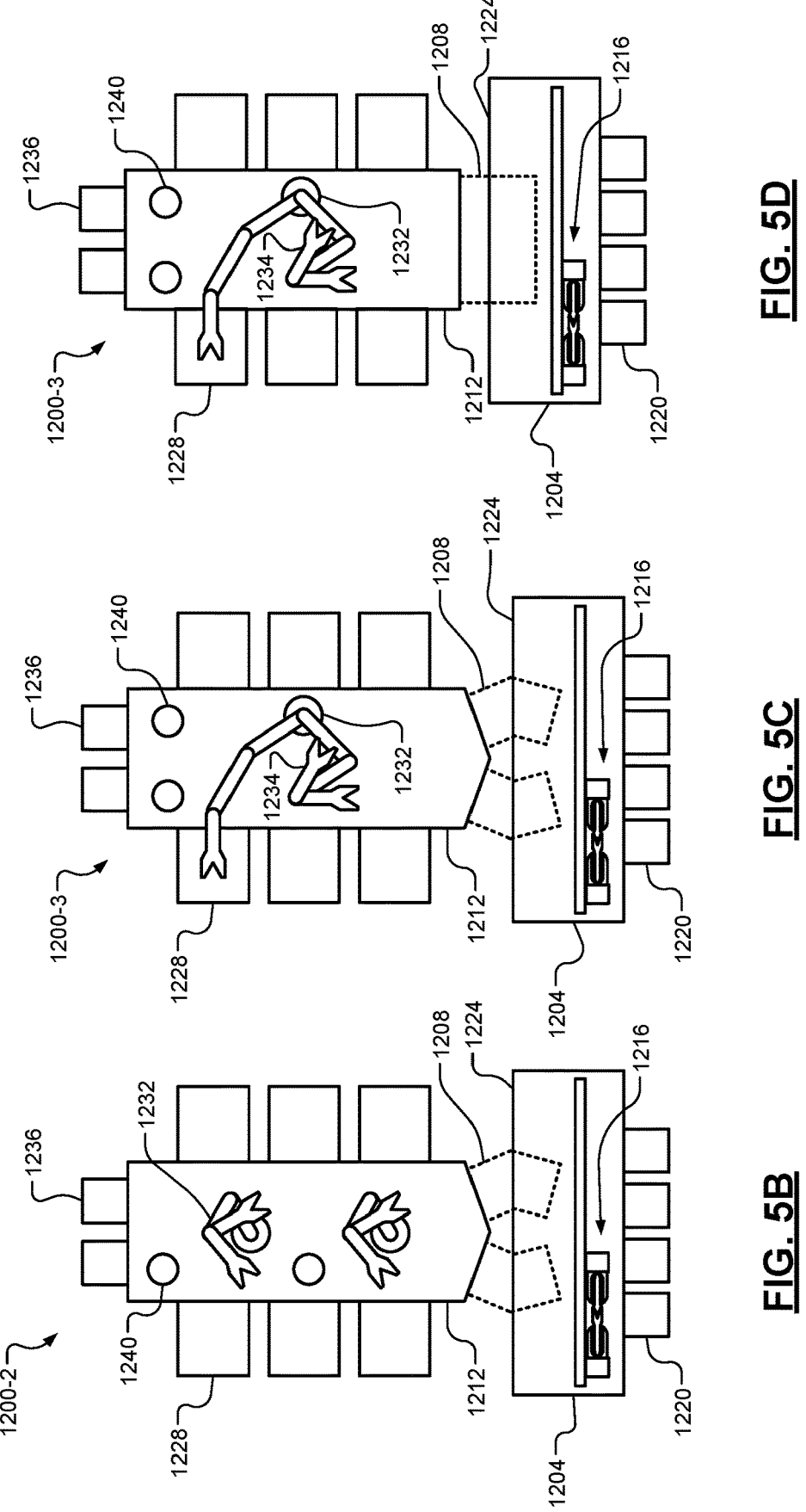

Conversely, the substrate processing tool 1200-3 includes a single vacuum transfer robot 1232 arranged off-center (i.e., shifted to the right or left toward the process modules 1228) relative to the center lengthwise axis of the 1VTM 212. In other words, a primary pivot point of the robot 1232 is off-center. Although shown as having one or two arms, each of the robots 1216 and 1232 may have configurations including one, two, or more arms. In some examples, the robot 1232 may include two end effectors 1234 on each of the arms as shown in FIGS. 5C and 5D.

The substrate processing tools 1200 may include one or more storage buffers 236 configured to store one or more substrates between processing stages. In some examples, storage buffers 1240 may be located within the VTM 1212. In some examples, one or more of the storage buffers 1236 may be replaced with process modules or other components.

In some examples, one or more of the EFEM 1204, the load locks 1208, the VTM 1212, and the process modules 1228 may have a stacked configuration. For example, each of the process modules 1228 may correspond to two process modules 1228 in a vertically stacked configuration (i.e., one process module 1228 arranged above/below the other), the VTM 1212 may correspond to two VTMs 1212 in the vertically stacked configuration, each of the load locks 1208 may correspond to two load locks 1208 in the vertically stacked configuration, and each of the loading stations 1220 may correspond to two loading stations 1220 in the vertically stacked configuration. A height of the EFEM 1204 may be increased to allow the robot 1216 to be raised and lowered to different levels within the EFEM 1204 to access multiple levels of the loading stations 1220 and the load locks 1208.

In the above examples, as explained in detail below with reference to FIGS. 8 and 9, a cleaning system including gas purge ports to clean various robot arms can be installed in various locations (e.g., EFEM, VTM, airlocks).

Figures 6A, 6B, 6C:
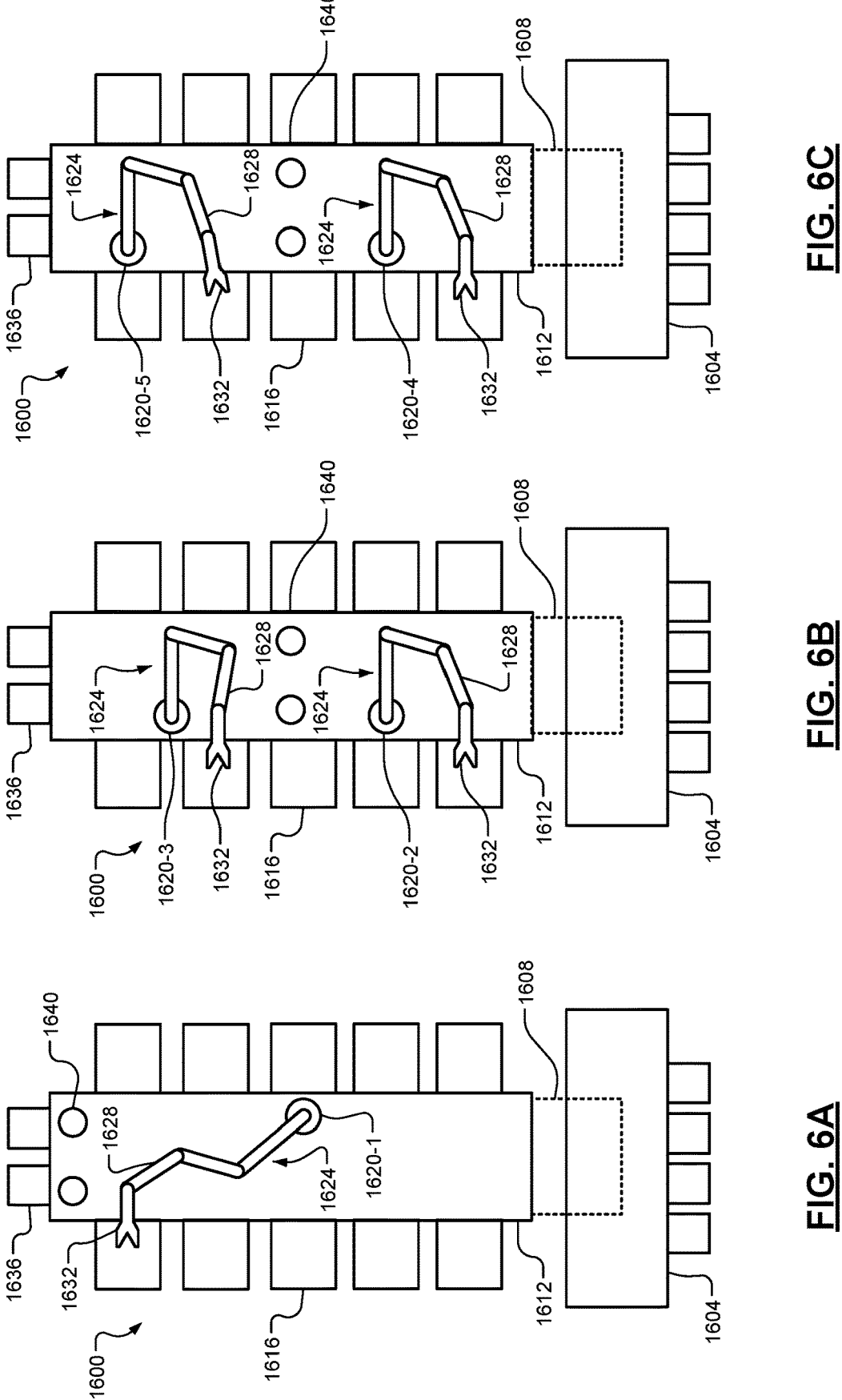
FIGS. 6A through 6C show plan views of additional example configurations of the substrate processing tools.

FIGS. 6A-6C show plan views of example configurations of another substrate processing tool 1600. The substrate processing tool 1600 includes a modified equipment front end module (EFEM) 1604 configured to accommodate at least a portion of one or more load locks 1608. In other words, instead of being located entirely outside of the EFEM 1604 in a gap between the EFEM 1604 and a vacuum transfer module (VTM) 1612, the load locks 1608 extend into an interior of the EFEM 1604. Accordingly, the EFEM 1604 can be located closer to the VTM 1612, reducing the overall footprint and increasing the pitch of a plurality of the substrate processing tools 1600.

As shown, the substrate processing tool 1600 includes ten process modules 1616. However, other configurations of the substrate processing tools 1600 may include more than ten of the process modules 1616. For example, a length of the VTM 1612 may be extended to accommodate additional process modules 1616. Similarly, the VTM 1612 may include vacuum one or more transfer robots 1620 (e.g., transfer robots 1620-1, 1620-2, 1620-3, 1620-4, and 1620-5) having various configurations. As shown, the transfer robots 1620 include one arm 1624 having three arm segments 1628 and one end effector 1632 in each of the configurations. In other configurations, the transfer robots 1620 may include one, two, or more arms 1624. In some examples, the robots 1620 may include two of the end effectors 1632 on each of the arms 1624.

In FIG. 6A, the substrate processing tool 1600 includes a single vacuum transfer robot 1620-1 arranged off-center (i.e., shifted to the right or left toward the process modules 1616) relative to the center lengthwise axis of the VTM 1612. In other words, a primary pivot point of the robot 1620-1 is off-center. The robot 1620-1 is positioned and configured to access each of the ten process modules 1616 and the load lock(s) 1608. In configurations where the substrate processing tool 1600 includes storage buffers 1636 and/or storage buffers 1640, the robot 1620-1 is also configured to access the storage buffers 1636/1640.

In FIGS. 6B and 6C, the substrate processing tool 1600 includes two vacuum transfer robot 1620-2 and 1620-3 or 1620-4 and 1620-5, respectively, arranged off-center (i.e., shifted to the right or left toward the process modules 1616) relative to the center lengthwise axis of the VTM 1612. The robots 1620-2 and 1620-4 are positioned and configured to access selected ones of the ten process modules 1616 and the load lock(s) 608. Conversely, the robots 1620-3 and 1620-5 are positioned and configured to access others of the ten process modules 1616. In configurations where the substrate processing tool 1600 includes storage buffers 1636 and/or storage buffers 1640, the robots 1620-3 and 1620-5 may also be configured to access the storage buffers 1636, while both of the robots 1620-2 and 1620-3 in FIG. 6B and both of the robots 1620-4 and 1620-5 in FIG. 6A are configured to access the storage buffers 1640.

For example, as shown in FIG. 6B, the robot 1620-2 is aligned with (e.g., centered on a horizontal axis of) a respective one of the process modules 1616 while the robot 1620-3 is arranged centered between adjacent ones of the process modules 1616. Conversely, as shown in FIG. 6C, each of the robots 1620-4 and 1620-5 is aligned with a respective one of the process modules 1616.

In the above examples, as explained in detail below with reference to FIGS. 8 and 9, a cleaning system including gas purge ports to clean various robot arms can be installed in various locations (e.g., EFEM, VTM, airlocks).

Examples of Chambers

Figure 7A:
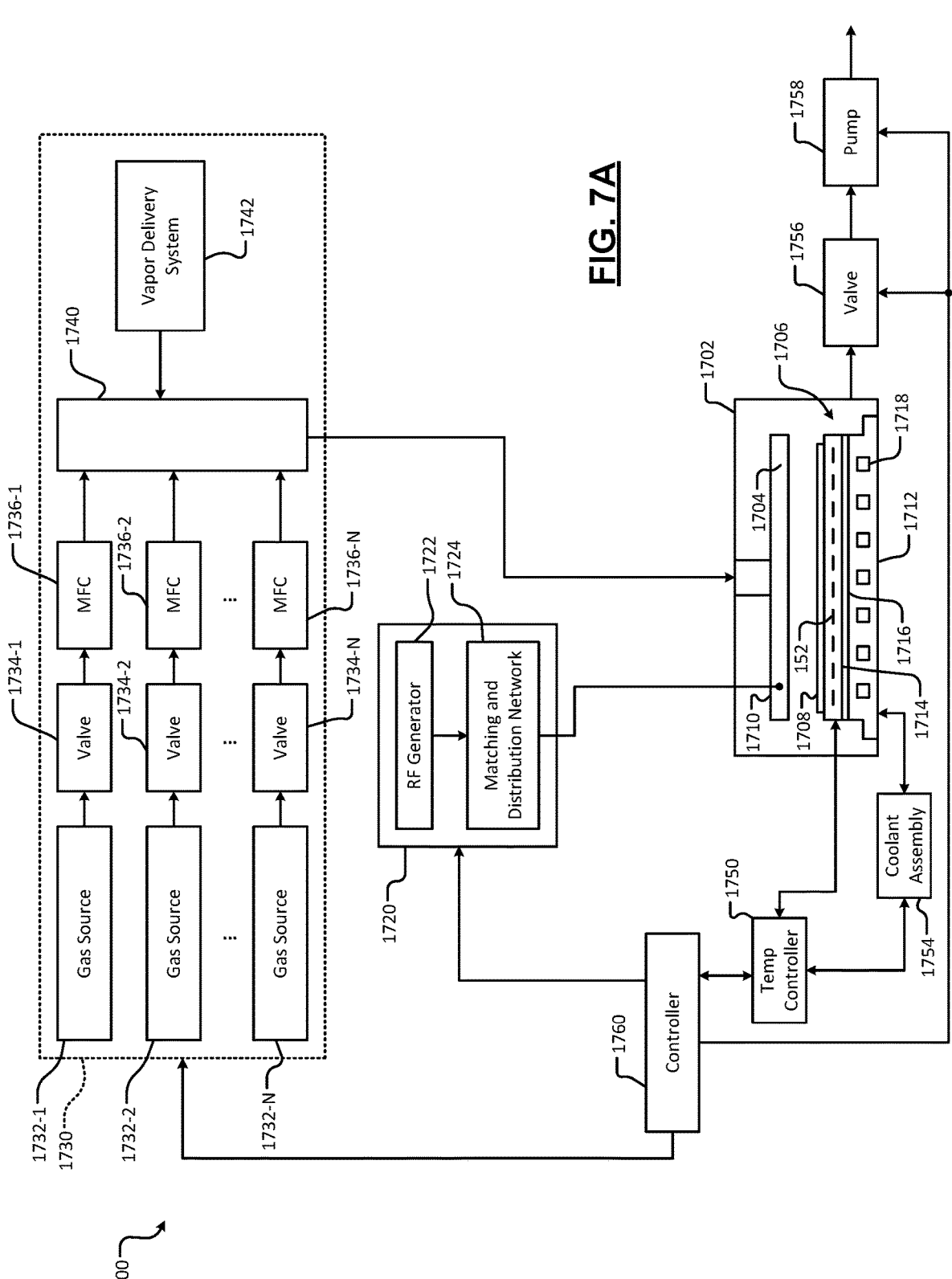
FIGS. 7A-7C show functional block diagrams of substrate processing systems comprising various processing chambers.
Figure 7B:
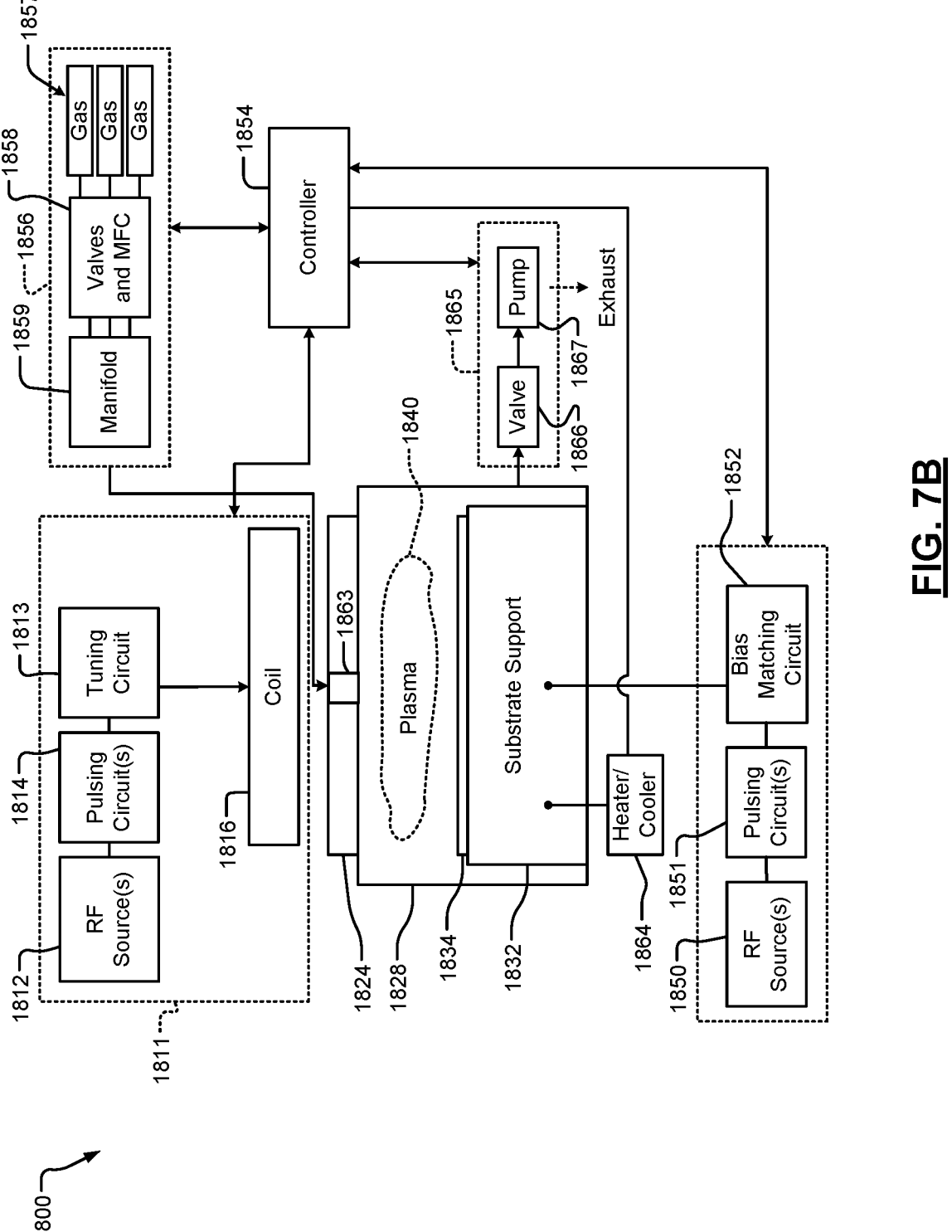
Figure 7C:
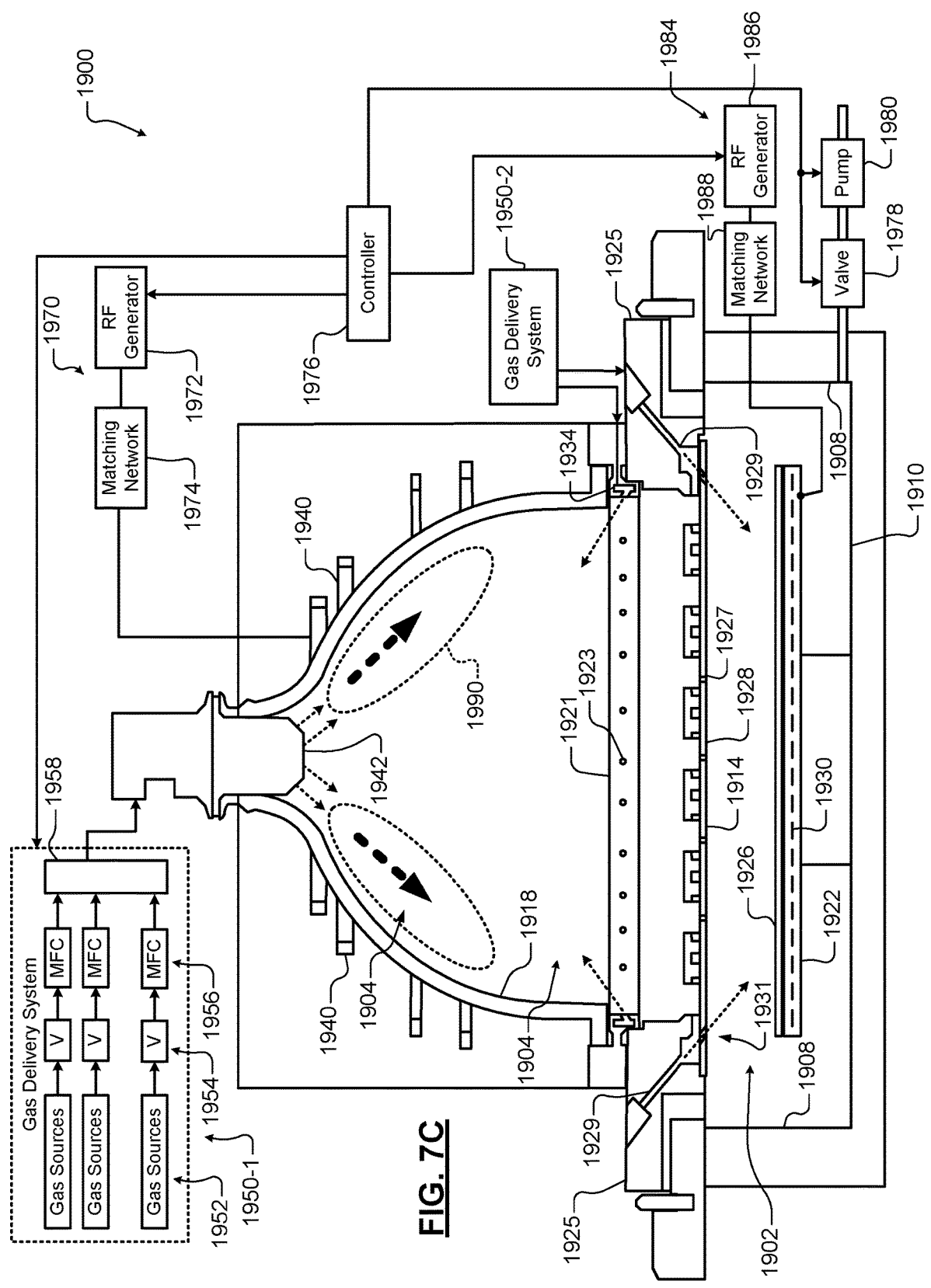

FIGS. 7A-7C show different examples of process modules (PMs) that can be used in the tools shown in FIGS. 1-6C. The robot arms described with reference to FIGS. 1-6C above transport wafers between the process modules in a tool as well as across the tools. The system and method for cleaning these robot arms is subsequently described below with reference to FIGS. 8 and 9.

FIG. 7A shows an example of a substrate processing system 1700 comprising a processing chamber 1702. While the example is described in the context of plasma enhanced chemical vapor deposition (PECVD), the teachings of the present disclosure can be applied to other types of substrate processing such as atomic layer deposition (ALD), plasma enhanced ALD (PEALD), CVD, or also other processing including etching processes. The system 1700 comprises the processing chamber 1702 that encloses other components of the system 1700 and contains an RF plasma (if used). The processing chamber 1702 comprises an upper electrode 1704 and an electrostatic chuck (ESC) 1706 or other substrate support. During operation, a substrate 1708 is arranged on the ESC 1706.

For example, the upper electrode 1704 may include a gas distribution device 1710 such as a showerhead that introduces and distributes process gases. The gas distribution device 1710 may include a stem portion including one end connected to a top surface of the processing chamber 1702. A base portion of the showerhead is generally cylindrical and extends radially outwardly from an opposite end of the stem portion at a location that is spaced from the top surface of the processing chamber 1702. A substrate-facing surface or faceplate of the base portion of the showerhead includes a plurality of holes through which vaporized precursor, process gas, or purge gas flows. Alternately, the upper electrode 1704 may include a conducting plate, and the process gases may be introduced in another manner.

The ESC 1706 comprises a baseplate 1712 that acts as a lower electrode. The baseplate 1712 supports a heating plate 1714, which may correspond to a ceramic multi-zone heating plate. A thermal resistance layer 1716 may be arranged between the heating plate 1714 and the baseplate 1712. The baseplate 1712 may include one or more channels 1718 for flowing coolant through the baseplate 1712.

If plasma is used, an RF generating system 1720 generates and outputs an RF voltage to one of the upper electrode 1704 and the lower electrode (e.g., the baseplate 1712 of the ESC 1706). The other one of the upper electrode 1704 and the baseplate 1712 may be DC grounded, AC grounded, or floating. For example, the RF generating system 1720 may include an RF generator 1722 that generates RF power that is fed by a matching and distribution network 1724 to the upper electrode 1704 or the baseplate 1712. In other examples, the plasma may be generated inductively or remotely.

A gas delivery system 1730 includes one or more gas sources 1732-1, 1732-2, . . . , and 1732-N (collectively gas sources 1732), where N is an integer greater than zero. The gas sources 1732 are connected by valves 1734-1, 1734-2, . . . , and 1734-N (collectively valves 1734) and mass flow controllers 1736-1, 1736-2, . . . , and 1736-N (collectively mass flow controllers 1736) to a manifold 1740. A vapor delivery system 1742 supplies vaporized precursor to the manifold 1740 or another manifold (not shown) that is connected to the processing chamber 1702. An output of the manifold 1740 is fed to the processing chamber 1702.

A temperature controller 1750 may be connected to a plurality of thermal control elements (TCEs) 1752 arranged in the heating plate 1714. The temperature controller 1750 may be used to control the plurality of TCEs 1752 to control a temperature of the ESC 1706 and the substrate 1708. The temperature controller 1750 may communicate with a coolant assembly 1754 to control coolant flow through the channels 1718. For example, the coolant assembly 1754 may include a coolant pump, a reservoir, and one or more temperature sensors (not shown). The temperature controller 1750 operates the coolant assembly 1754 to selectively flow the coolant through the channels 1718 to cool the ESC 1706. A valve 1756 and pump 1758 may be used to evacuate reactants from the processing chamber 1702. A system controller 1760 controls the components of the system 1700.

FIG. 7B shows another example of a substrate processing system 1800. The substrate processing system 1800 includes a coil driving circuit 1811. In some examples, the coil driving circuit 1811 includes an RF source 1812, a pulsing circuit 1814, and a tuning circuit (i.e., matching circuit) 1813. The pulsing circuit 1814 controls a transformer coupled plasma (TCP) envelope of an RF signal generated by the RF source 1812 and varies a duty cycle of TCP envelope between 1% and 99% during operation. As can be appreciated, the pulsing circuit 1814 and the RF source 1812 can be combined or separate.

The tuning circuit 1813 may be directly connected to an inductive coil 1816. While the substrate processing system 1810 uses a single coil, some substrate processing systems may use a plurality of coils (e.g., inner and outer coils). The tuning circuit 1813 tunes an output of the RF source 1812 to a desired frequency and/or a desired phase, and matches an impedance of the coil 1816.

A dielectric window 1824 is arranged along a top side of a processing chamber 1828. The processing chamber 1828 comprises a substrate support (or pedestal) 1832 to support a substrate 1834. The substrate support 1832 may include an electrostatic chuck (ESC), or a mechanical chuck or other type of chuck. Process gas is supplied to the processing chamber 1828 and plasma 1840 is generated inside of the processing chamber 1828. The plasma 1840 etches an exposed surface of the substrate 1834. An RF source 1850, a pulsing circuit 1851, and a bias matching circuit 1852 may be used to bias the substrate support 1832 during operation to control ion energy.

A gas delivery system 1856 may be used to supply a process gas mixture to the processing chamber 1828. The gas delivery system 1856 may include process and inert gas sources 1857, a gas metering system 1858 such as valves and mass flow controllers, and a manifold 1859. A gas injector 1863 may be arranged at a center of the dielectric window 1824 and is used to inject gas mixtures from the gas delivery system 1856 into the processing chamber 1828.

Additionally or alternatively, the gas mixtures may be injected from the side of the processing chamber 1828.

A heater/cooler 1864 may be used to heat/cool the substrate support 1832 to a predetermined temperature. An exhaust system 1865 includes a valve 1866 and pump 1867 to control pressure in the processing chamber and/or to remove reactants from the processing chamber 1828 by purging or evacuation.

A controller 1854 may be used to control the etching process. The controller 1854 monitors system parameters and controls delivery of the gas mixture; striking, maintaining, and extinguishing the plasma; removal of reactants; supply of cooling gas; and so on. Additionally, as described below, the controller 1854 may control various aspects of the coil driving circuit 1810, the RF source 1850, and the bias matching circuit 1852, and so on.

FIG. 7C shows a processing chamber 1900 for etching a layer of a substrate. The processing chamber 1900 includes a lower chamber region 1902 and an upper chamber region 1904. The lower chamber region 1902 is defined by chamber sidewall surfaces 1908, a chamber bottom surface 1910, and a lower surface of a gas distribution device 1914.

The upper chamber region 1904 is defined by an upper surface of the gas distribution device 1914 and an inner surface of a dome 1918. In some examples, the dome 1918 rests on a first annular support 1921. In some examples, the first annular support 1921 includes one or more spaced holes 1923 for delivering process gas to the upper chamber region 1904. In some examples, the process gas is delivered by the one or more spaced holes 1923 in an upward direction at an acute angle relative to a plane including the gas distribution device 1914, although other angles/directions may be used. In some examples, a gas flow channel 1934 in the first annular support 1921 supplies gas to the one or more spaced holes 1923.

The first annular support 1921 may rest on a second annular support 1925 that defines one or more spaced holes 1927 for delivering process gas from a gas flow channel 1929 to the lower chamber region 1902. In some examples, holes 1931 in the gas distribution device 1914 align with the holes 1927. In other examples, the gas distribution device 1914 has a smaller diameter, and the holes 1931 are not needed. In some examples, the process gas is delivered by the one or more spaced holes 1927 in a downward direction towards a substrate 1926 at an acute angle relative to the plane including the gas distribution device 1914, although other angles/directions may be used. In other examples, the upper chamber region 1904 is cylindrical with a flat top surface and one or more flat inductive coils may be used. In still other examples, a single chamber may be used with a spacer located between a showerhead and the substrate support.

A substrate support 1922 is arranged in the lower chamber region 1904. In some examples, the substrate support 1922 includes an electrostatic chuck (ESC), although other types of substrate supports can be used. The substrate 1926 is arranged on an upper surface of the substrate support 1922 during etching. In some examples, a temperature of the substrate 1926 may be controlled by a heater plate 1930, an optional cooling plate with fluid channels, and one or more sensors (not shown), although any other suitable substrate support temperature control system may be used.

In some examples, the gas distribution device 1914 includes a showerhead (for example, a plate 1928 having a plurality of spaced holes 1927). The plurality of spaced holes 1927 extend from the upper surface of the plate 1928 to the lower surface of the plate 1928. In some examples, the spaced holes 1927 have a diameter in a range from 0.4" to 0.75" and the showerhead is made of a conducting material such as aluminum or a non-conductive material such as ceramic with an embedded electrode made of a conducting material.

One or more inductive coils 1940 are arranged around an outer portion of the dome 1918. When energized, the one or more inductive coils 1940 create an electromagnetic field inside of the dome 1918. In some examples, an upper coil and a lower coil are used. A gas injector 1942 injects one or more gas mixtures from a gas delivery system 1950-1.

In some examples, the gas delivery system 1950-1 includes one or more gas sources 1952, one or more valves 1954, one or more mass flow controllers (MFCs) 1956, and a mixing manifold 158, although other types of gas delivery systems may be used. A gas splitter (not shown) may be used to vary flow rates of a gas mixture. Another gas delivery system 1950-2 may be used to supply an etch gas or an etch gas mixture to the gas flow channels 1929 and/or 1934 (in addition to or instead of etch gas from the gas injector 1942).

In some examples, the gas injector 1942 includes a center injection location that directs gas in a downward direction and one or more side injection locations that inject gas at an angle with respect to the downward direction. In some examples, the gas delivery system 1950-1 delivers a first portion of the gas mixture at a first flow rate to the center injection location and a second portion of the gas mixture at a second flow rate to the side injection location(s) of the gas injector 1942. In other examples, different gas mixtures are delivered by the gas injector 1942. In some examples, the gas delivery system 1950-1 delivers tuning gas to the gas flow channels 1929 and 1934 and/or to other locations in the processing chamber as will be described below.

A plasma generator 1970 may be used to generate RF power that is output to the one or more inductive coils 1940. Plasma 1990 is generated in the upper chamber region 1904. In some examples, the plasma generator 1970 includes an RF generator 1972 and a matching network 1974. The matching network 1974 matches an impedance of the RF generator 1972 to the impedance of the one or more inductive coils 1940. In some examples, the gas distribution device 1914 is connected to a reference potential such as ground. A valve 1978 and a pump 1980 may be used to control pressure inside of the lower and upper chamber regions 1902, 1904 and to evacuate reactants.

A controller 1976 communicates with the gas delivery systems 1950-1 and 1950-2, the valve 1978, the pump 1980, and the plasma generator 1970 to control flow of process gas, purge gas, RF plasma and chamber pressure. In some examples, plasma is sustained inside the dome 1918 by the one or more inductive coils 1940. One or more gas mixtures are introduced from a top portion of the chamber using the gas injector 1942 (and/or holes 1923), and plasma is confined within the dome 1918 using the gas distribution device 1914.

Confining the plasma in the dome 1918 allows volume recombination of plasma species and effusing desired etchant species through the gas distribution device 1914. In some examples, there is no RF bias applied to the substrate 1926. As a result, there is no active sheath on the substrate 1926 and ions are not hitting the substrate with any finite energy. Some amount of ions will diffuse out of the plasma region through the gas distribution device 1914. However, the amount of plasma that diffuses is an order of magnitude lower than the plasma located inside the dome 1918. Most ions in the plasma are lost by volume recombination at high pressures. Surface recombination loss at the upper surface of the gas distribution device 1914 also lowers ion density below the gas distribution device 1914.

In other examples, an RF bias generator 1984 is provided and includes an RF generator 1986 and a matching network 1988. The RF bias can be used to create plasma between the gas distribution device 1914 and the substrate support or to create a self-bias on the substrate 1926 to attract ions. The controller 1976 may be used to control the RF bias.

The robot arms transport wafers between these process modules in various tools as explained above. The robot arms accumulate material while transporting the wafers within as well as across tools. If not cleaned, this material can contaminate wafers handled by the robot arms. Further, the accumulated material can also make the robot arms slippery, which can impair the ability of the robot arms to safely transport the wafers, which can cause damage to the wafers, which can be extremely costly. The cleaning system and method described below cleans the robot arms.

Autocleaning System

Figure 8:
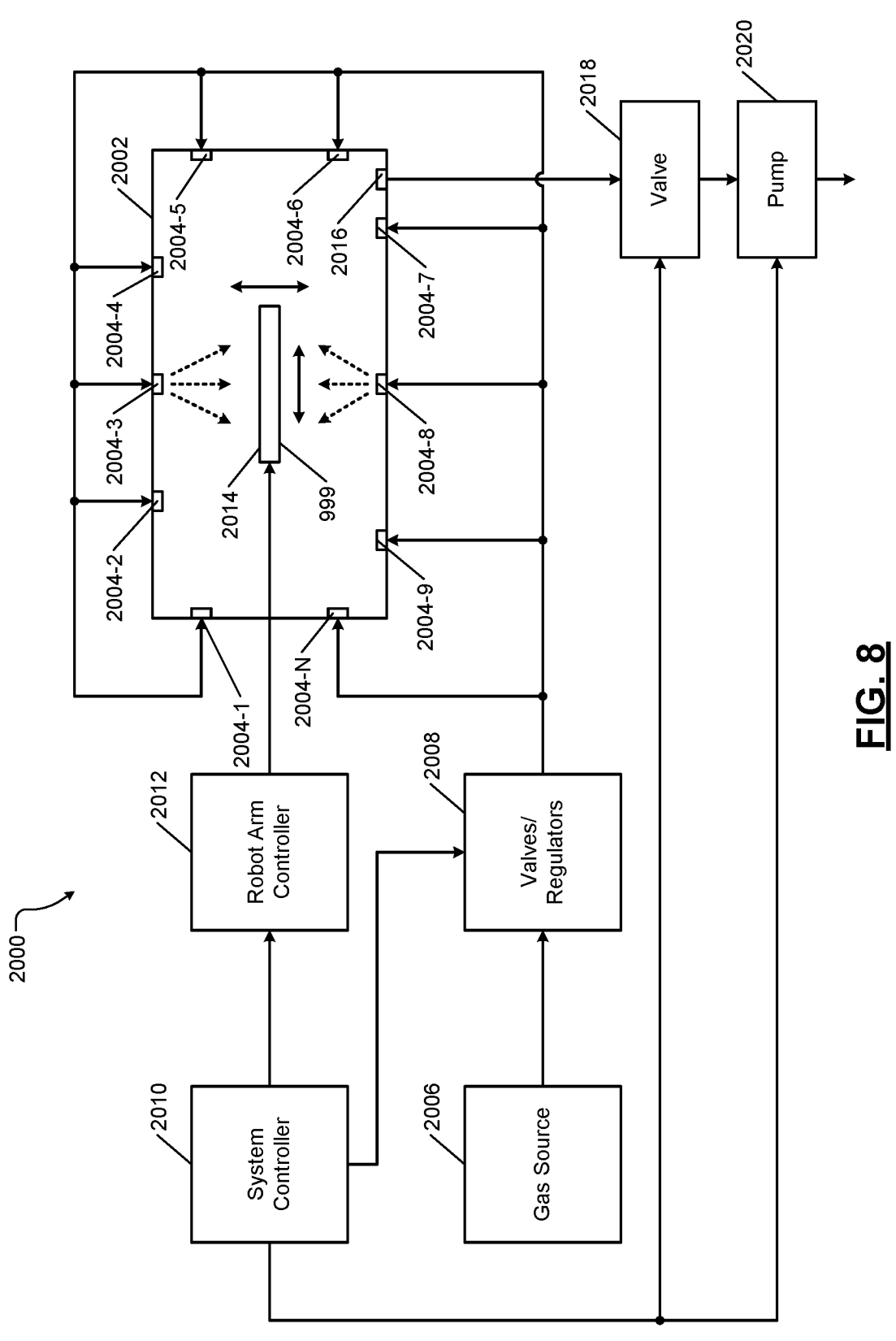
FIG. 8 shows a block diagram of a system for autocleaning a robot arm according to the present disclosure.

FIG. 8 shows an example of a system 2000 for cleaning a robot arm. The system 2000 is shown schematically. For example only, the system 2000 is shown in conjunction with an airlock chamber. The purge ports of the system 2000 can be installed in an airlock chamber or elsewhere in any tool shown in FIGS. 1-6C above. For example, the purge ports can be installed in an EFEM and/or a VTM. Further, a robot arm is shown without an end effector so as to not crowd (complicate) the figure. The cleaning process performed by the system 2000 as described below cleans the robot arm as well as its end effector.

The system 2000 comprises an airlock chamber 2002, for example. The airlock chamber 2002 comprises a plurality of purge ports (hereinafter also called simply ports or inlets). The ports are shown as 2004-1, 2004-2, . . . , and 2004-N (collectively ports or inlets 2004), where N is an integer greater than 1. The number and locations of the ports 2004 can vary.

The system 2000 comprises a gas source 2006 and a set of valves and/or regulators 2008. The gas source 2006 supplies a purge gas such as N2 to the ports 2004 via the regulators 2008. The regulators 2008 control the pressure and flow rates of the purge gas through the ports 2004. For example, the regulators 2008 can turn one or more of the ports 2004 on or off at varying duty cycles. For example, the regulators 2008 can vary the flow rate of the purge gas through each port 2004 individually (i.e., independent of other ports 2004). While only one gas sources is shown, multiple gas sources supplying different gases can be used along with respective regulators.

The system 2000 comprises a system controller 2010 and a robot arm controller 2012. The robot arm controller 2012 controls the movement of a robot arm 2014 in the airlock chamber 2002 during the cleaning process. For example, the robot arm controller 2012 can move the robot arm 2014 in any direction along X, Y, and Z axes during the cleaning process (i.e., while the purge gas is being expelled from the ports 2004). For example, the directions in which the robot arm 2014 can be moved in the airlock chamber 2002 include up, down, sideways, forward, backward, and/or circular (i.e., rotary). Any combination of these movements may be used.

Further, during the cleaning process (i.e., while the purge gas is being expelled from the ports 2004), the robot arm controller 2012 can move the robot arm 2014 in any of the directions in any pattern of movement (e.g., in a zig-zag pattern). Additionally or alternatively, the robot arm controller 2012 can mildly vibrate the robot arm 2014 during the cleaning process. For example, the robot arm controller 2012 selects the type of movement of the robot arm 2014 within the airlock chamber 2002 during the cleaning process depending on the type of the robot arm 2014 and the degree or extent to which the robot arm 2014 is dirty and needs to be cleaned. The system controller 2010 controls the robot arm controller 2012 and the regulators 2008 during the cleaning process (i.e., while the purge gas is being expelled from the ports 2004). While the robot arm controller 2012 is shown separately from the system controller 2010, the robot arm controller 2012 may be integrated with the system controller 2010.

When multiple gas sources are used, the system controller 2010 can also select different gas sources during the cleaning process. For example, the system controller 2010 may initially select a first gas source, then select a second gas source after a period of time, and so on. The system controller 2010 may also switch the gas sources in any sequence during the cleaning process. Further, the system controller 2010 may switch the gas sources in combination with the activating/deactivating different ports 2004, moving the robot arm 2014 in different patterns, and increasing/ decreasing flow rates of the selected purge gases through the ports 2004.

The airlock chamber 2002 also comprises an exhaust port or an outlet 2016. While only one exhaust port is shown, multiple exhaust ports may be used at different locations in the airlock chamber 2002 (or in the EFEM and VTM). A valve 2018 and a pump 2020 are connected to the exhaust port 2016 as shown. Through the exhaust port 2016, the pump 2020 removes or expels the purge gas introduced into the airlock chamber 2002 by the ports 2004 and any particulate matter ejected from the robot arm 2014 during the cleaning process.

In some implementations, separate ports may be provided (and activated/deactivated by the system controller 2010 as described above) for ATM and VTM robots and can be located in EFEM, VTM, and/or airlocks. Further, the cleaning process may be performed in an open chamber (i.e., in presence of atmospheric pressure for ATM/VTM robots) or in a closed chamber (i.e., in absence of atmospheric pressure for VTM robot). In some implementations, to use the system 2000 to clean the VTM robot arm, the VTM can be purged before opening the airlock door to perform this cleaning procedure. Different paths can be defined by the system controller 2010 to move the robot arm in X, Y, and Z directions as described above while the purge gas is dispensed from the ports 2004 to achieve an optimal rate at which particles are removed from the robot arm.

The system 2000 can operate in conjunction with other systems that control the tools. For example, the system 2000 can operate in conjunction with other diagnostic and maintenance systems associated with the tool. Accordingly, the system 2000 can be controlled by a system computer that controls the tool or a fleet of tools in a fab. The system computer can coordinate the operation of the system 2000 along with the other diagnostic and maintenance systems controlled by the system computer.

For example, the system controller 2010 can be programmed by an operator of a tool or by the system computer to automatically clean the robot arms of the tool at suitable times selected based on the processes performed in the process modules of the tool. For example, the system controller 2010 can determine time windows in which to clean the robot arms depending on the processes performed in the process modules of the tool. For example, the system controller 2010 can determine a frequency at which to clean the robot arms depending on the processes performed in the process modules of the tool.

The system controller 2010 interfaces with other scheduling programs associated with the tool and executed by the system computer. These scheduling programs may automatically trigger the cleaning process of the robot arms at predetermined times (e.g., after a batch of wafers is processed) or on demand based on occurrence of an event such as a warning or an error in wafer handling that can be attributable to a robot arm being or becoming due for maintenance. These triggers may vary depending on the processes performed in the tool.

Figure 9:
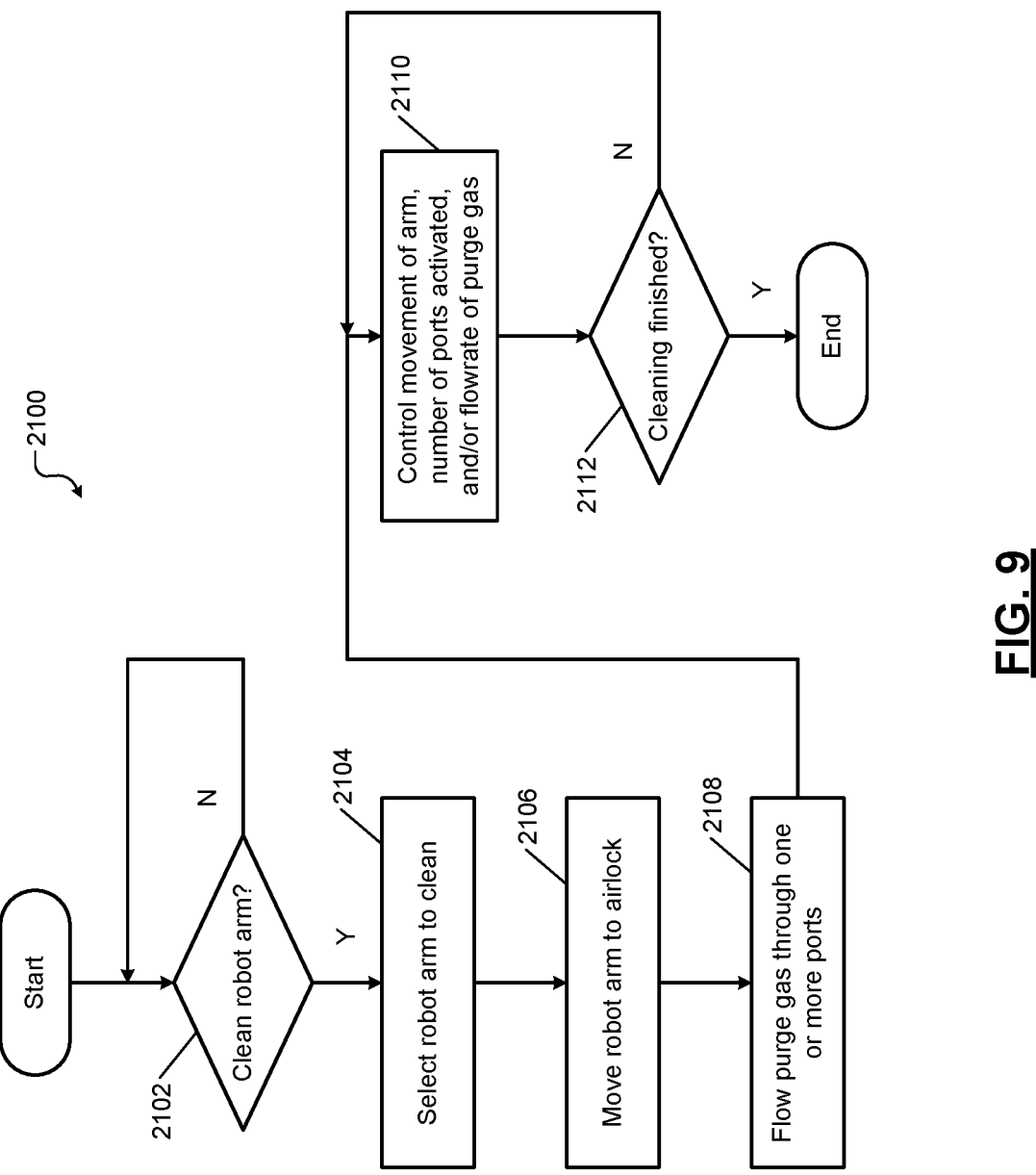
FIG. 9 shows a flowchart of a method for autocleaning a robot arm according to the present disclosure.

FIG. 9 shows an example of a method 2100 for cleaning a robot arm. For example, the method 2100 may be performed by the system controller 2010. At 2102, the method 2100 determines whether it is time to automatically clean a robot arm. For example, the method 2100 may determine whether to clean the robot arm based on various factors (e.g., processes performed in the tool, number of wafers processed in the tool, scheduling of other maintenance activities, events triggering the cleaning, etc.) as explained above.

At 2104, the method 2100 selects the robot arm to be cleaned. At 2106, the method 2100 moves the selected robot arm into a chamber or an enclosure of the tool such as an airlock, EFEM, or VTM. At 2108, the method 2100 dispenses or injects a purge gas into the chamber through one or more ports or inlets arranged around the chamber. As explained above with reference to FIG. 8, the method 2100 may further select suitable purge gas or gases, ports, and so on to perform the cleaning process, the description of which is not repeated for brevity.

At 2110, the method 2100 controls the movement of the robot arm, the number of ports activated/deactivated at different times during the cleaning process, and/or the flow rates of the purge gas dispensed through the ports, as explained in detail above with reference to FIG. 8. Again, the description is not repeated for brevity. While not explicitly shown, the method 2100 exhausts/expels from the chamber the purge gas and any particulate matter ejected from the robot during the cleaning process as explained above with reference to FIG. 8.

At 2112, the method 2100 determines whether the robot arm is clean and whether to terminate the cleaning process. The method 2100 may determine whether to end the cleaning process in one of many ways. For example, the method 2100 may determine whether to terminate the cleaning process after an empirically determined period of time. For example, the method 2100 may determine whether to terminate the cleaning process after a predetermined time elapses. For example, the method 2100 may determine the predetermined time for which to perform the cleaning process based on the type of processing being performed in the tool, the number of wafers being processed in the tool, the frequency at which the cleaning process is being currently performed, whether the robot arm is operating error-free at the currently used cleaning frequency, and other factors.

In another example, the method 2100 may determine whether to terminate the cleaning process based on data received from other systems. For example, the method 2100 may determine whether to terminate the cleaning process based on a sensor sensing a state of the robot arm. For example, in some tools, sensors such as cameras, laser sensors, and so on may be installed in the airlock chamber or elsewhere in the tool. These sensors can sense or monitor the state of the robot arm during the cleaning process. Based on the data collected by these sensors, the method 2100 can decide whether the robot arm is clean and whether to terminate the cleaning process.

The method 2100 may determine whether to end the cleaning process based on other criteria. After the cleaning process is completed, the robot arm is ready for use until the next automated cleaning is to be performed. The robot arm is returned/released for normal use.

The foregoing description is merely illustrative in nature and is not intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure.

Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements.

As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate.

The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software).

The program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process.

In some examples, a remote computer (e.g., a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control.

Accordingly, as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A system comprising:
an enclosure for a substrate processing system, the enclosure being separate from processing chambers of the substrate processing system that process a semiconductor substrate;
a plurality of inlets arranged around the enclosure, the plurality of inlets being configured to dispense only a gas into the enclosure; and
a controller configured to:
move into the enclosure a robot arm used to transport the semiconductor substrate between the processing chambers of the substrate processing system; and
dispense the gas into the enclosure through the inlets at different flow rates in response to the robot arm being moved into the enclosure of the substrate processing system to clean the robot arm.

2. The system of claim 1 wherein the enclosure includes one or more of an airlock chamber, a vacuum transfer module (VTM), and an equipment front end module (EFEM) of the substrate processing system.

3. The system of claim 1 wherein the controller is configured to move the robot arm in multiple directions within the enclosure while the gas is being dispensed into the enclosure of the substrate processing system.

4. The system of claim 1 wherein the controller is configured to move the robot arm within the enclosure in a predetermined pattern while the gas is being dispensed into the enclosure of the substrate processing system.

5. The system of claim 1 wherein the controller is configured to dispense the gas through the inlets by operating the inlets in a predetermined sequence.

6. The system of claim 1 wherein the controller is configured to dispense the gas through the inlets at a predetermined flow rate.

7. The system of claim 1 wherein the controller is configured to:
dispense the gas through a first set of the inlets in response to the robot arm being of a first type; and
dispense the gas through a second set of the inlets in response to the robot arm being of a second type,
wherein the second set of the inlets is different than the first set of the inlets.

8. The system of claim 1 further comprising:
a gas source configured to supply the gas; and
a plurality of regulators configured to regulate delivery of the gas from the gas source to the plurality of inlets, respectively,
wherein the controller is configured to control the regulators while delivering the gas to the plurality of inlets.

9. The system of claim 1 further comprising a valve and a pump configured to exhaust from the enclosure the gas dispensed into the enclosure and particulate matter ejected from the robot arm into the enclosure by the gas dispensed into the enclosure.

10. The system of claim 1 wherein the controller is configured to vibrate the robot arm within the enclosure while the gas is being dispensed into the enclosure of the substrate processing system.

11. A method comprising:
moving a robot arm used to transport a semiconductor substrate in a substrate processing system into an enclosure of the substrate processing system, the enclosure being separate from processing chambers of the substrate processing system that process the semiconductor substrate; and
dispensing only a gas through a plurality of inlets arranged around the enclosure into the enclosure of the substrate processing system at different flow rates in response to moving the robot arm into the enclosure of the substrate processing system to clean the robot arm.

12. The method of claim 11 wherein the enclosure includes one or more of an airlock chamber, a vacuum transfer module (VTM), and an equipment front end module (EFEM) of the substrate processing system.

13. The method of claim 11 further comprising moving the robot arm in multiple directions within the enclosure while dispensing the gas into the enclosure of the substrate processing system.

14. The method of claim 11 further comprising moving the robot arm within the enclosure in a predetermined pattern while dispensing the gas into the enclosure of the substrate processing system.

15. The method of claim 11 further comprising dispensing the gas through the inlets by operating the inlets in a predetermined sequence.

16. The method of claim 11 further comprising dispensing the gas through the inlets at a predetermined flow rate.

17. The method of claim 11 further comprising:
dispensing the gas through a first set of the inlets in response to the robot arm being of a first type; and
dispensing the gas through a second set of the inlets in response to the robot arm being of a second type,
wherein the second set of the inlets is different than the first set of the inlets.

18. The method of claim 11 further comprising:
supplying the gas from a gas source;
regulating delivery of the gas from the gas source to the plurality of inlets via a plurality of regulators, respectively; and
controlling the regulators while delivering the gas to the plurality of inlets.

19. The method of claim 11 further comprising expelling from the enclosure the gas dispensed into the enclosure and particulate matter ejected from the robot arm into the enclosure by the gas dispensed into the enclosure.

20. The method of claim 11 further comprising vibrating the robot arm within the enclosure while dispensing the gas into the enclosure of the substrate processing system.

* * * * *